United States Patent
Tsujii

(10) Patent No.: US 8,804,008 B2
(45) Date of Patent: Aug. 12, 2014

(54) DATA PROCESSING APPARATUS AND METHOD OF CONTROLLING SAME

(75) Inventor: Hideaki Tsujii, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 865 days.

(21) Appl. No.: 12/960,987

(22) Filed: Dec. 6, 2010

(65) Prior Publication Data

US 2011/0149114 A1    Jun. 23, 2011

(30) Foreign Application Priority Data

Dec. 17, 2009   (JP) ................. 2009-286967

(51) Int. Cl.
  *H04N 5/76*    (2006.01)
  *H04L 29/08*   (2006.01)
  *H04N 1/21*    (2006.01)
  *H04N 101/00*  (2006.01)
  *H04N 1/00*    (2006.01)

(52) U.S. Cl.
  CPC ........ *H04L 69/32* (2013.01); *H04N 2201/0087* (2013.01); *H04N 2101/00* (2013.01); *H04N 2201/0084* (2013.01); *H04N 2201/0013* (2013.01); *H04N 1/00347* (2013.01); *G06F 2213/0038* (2013.01); *H04N 2201/0086* (2013.01); *H04N 1/2112* (2013.01); *H04N 1/00925* (2013.01); *H04N 2201/0044* (2013.01)
  USPC .............. 348/231.8; 348/231.7; 348/231.9

(58) Field of Classification Search
  USPC ........................... 348/231.7–231.9
  See application file for complete search history.

(56) References Cited

U.S. PATENT DOCUMENTS 7,117,008 B2   10/2006 Bajikar

FOREIGN PATENT DOCUMENTS

| JP | 09-083930 A | 3/1997 |
| JP | 2003-199181 A | 7/2003 |
| JP | 2005-025464 A | 1/2005 |
| JP | 2005-065082 A | 3/2005 |
| JP | 2005-100103 | 4/2005 |
| JP | 2007-306224 A | 11/2007 |

OTHER PUBLICATIONS

The above references were cited in a Oct. 28, 2013 Japanese Office Action, which is enclosed without English Translation, that issued in Japanese Patent Application No. 2009-286967.
The above foreign patent documents were cited in a May 2, 2014 Japanese Office Action, a copy of which is enclosed without an English Translation, that issued in Japanese Patent Application No. 2014-041045.

*Primary Examiner* — Roberto Velez
*Assistant Examiner* — Yih-Sien Kao
(74) *Attorney, Agent, or Firm* — Cowan, Liebowitz & Latman, P.C.

(57) ABSTRACT

In a data processing apparatus having a plurality of card slots in which memory cards are removably inserted, it is determined, with regard to each of the plurality of card slots, whether a memory card that has been inserted into the slot is a wireless card having a wireless communication function. In a case where it is determined that a memory card that has been inserted into a first card slot among the plurality of card slots is the wireless card, the wireless communication function of the wireless card is enabled. In a case where it is determined that a memory card that has been inserted into a card slot other than the first card slot is the wireless card, the wireless communication function of the wireless card is disabled.

8 Claims, 6 Drawing Sheets

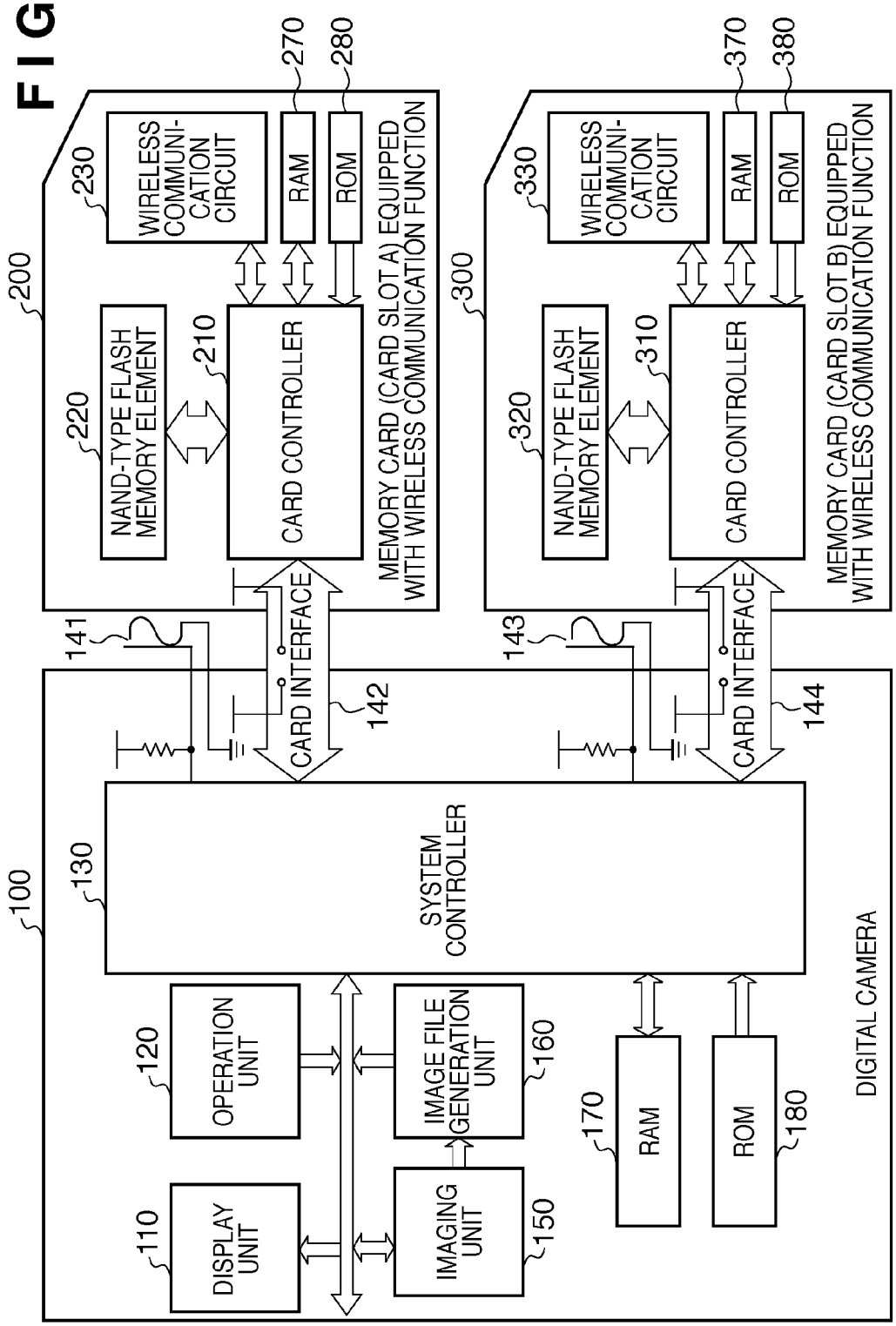

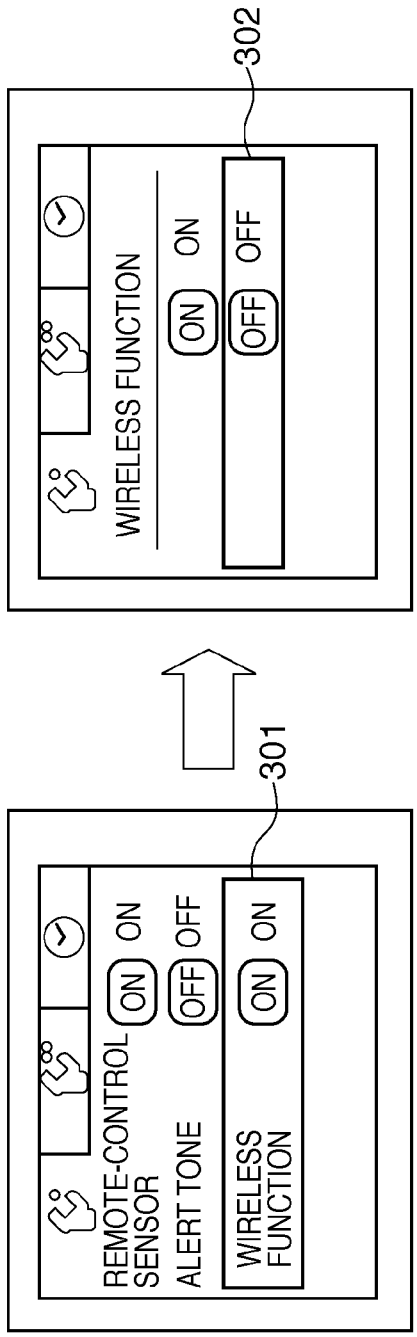
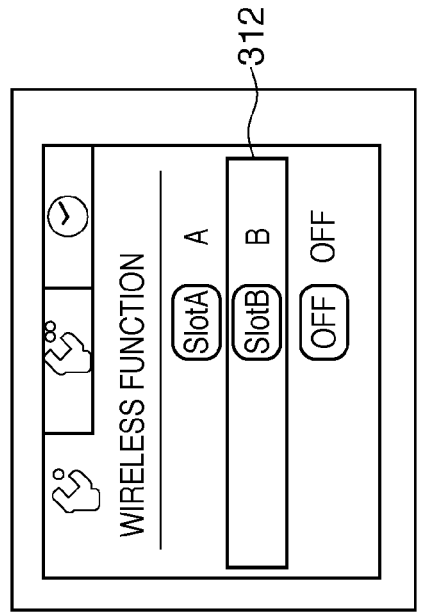
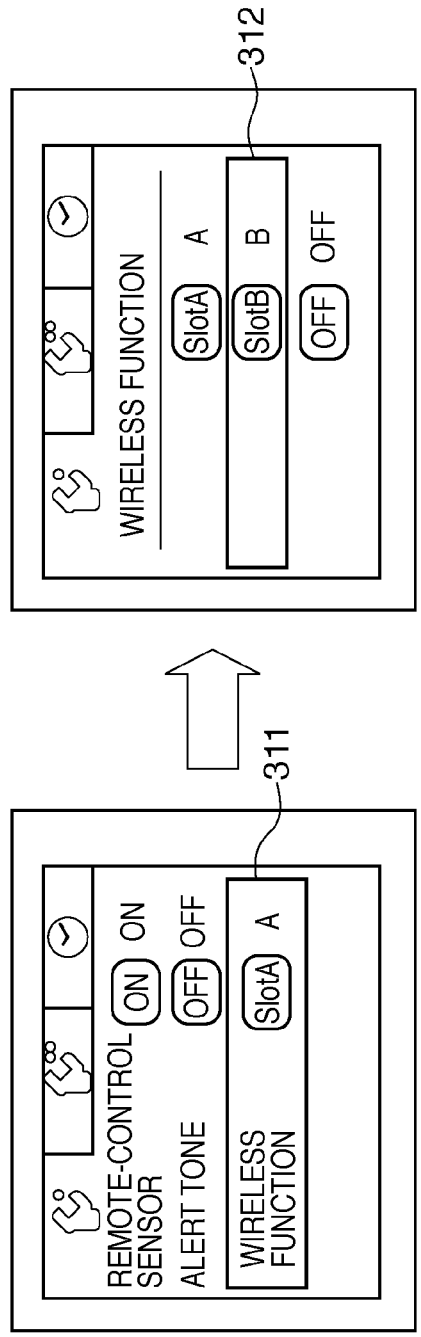

FIG. 3

| id | SCREEN | MEANING |
|---|---|---|
| - | (NO ICON) | WIRELESS COMMUNICATION CARD NOT YET INSERTED |
| 0 | SlotB 〵 | NOT CONNECT (GRAY) |
| 1 | SlotB 〵 | CURRENTLY CONNECTED (WHITE / FLASHING) |
| 2 | SlotB 〵 | AWAITING TRANSFER (WHITE) |
| 3 | SlotB 〵 SlotB | TRANSMISSION IN PROGRESS (WHITE / ANIMATED DISPLAY) |
| 4 | SlotB OFF | WIRELESS COMMUNICATION OFF (WHITE) |
| 5 | SlotB Error | CARD-INFORMATION ACQUISITION ERROR (RED) |

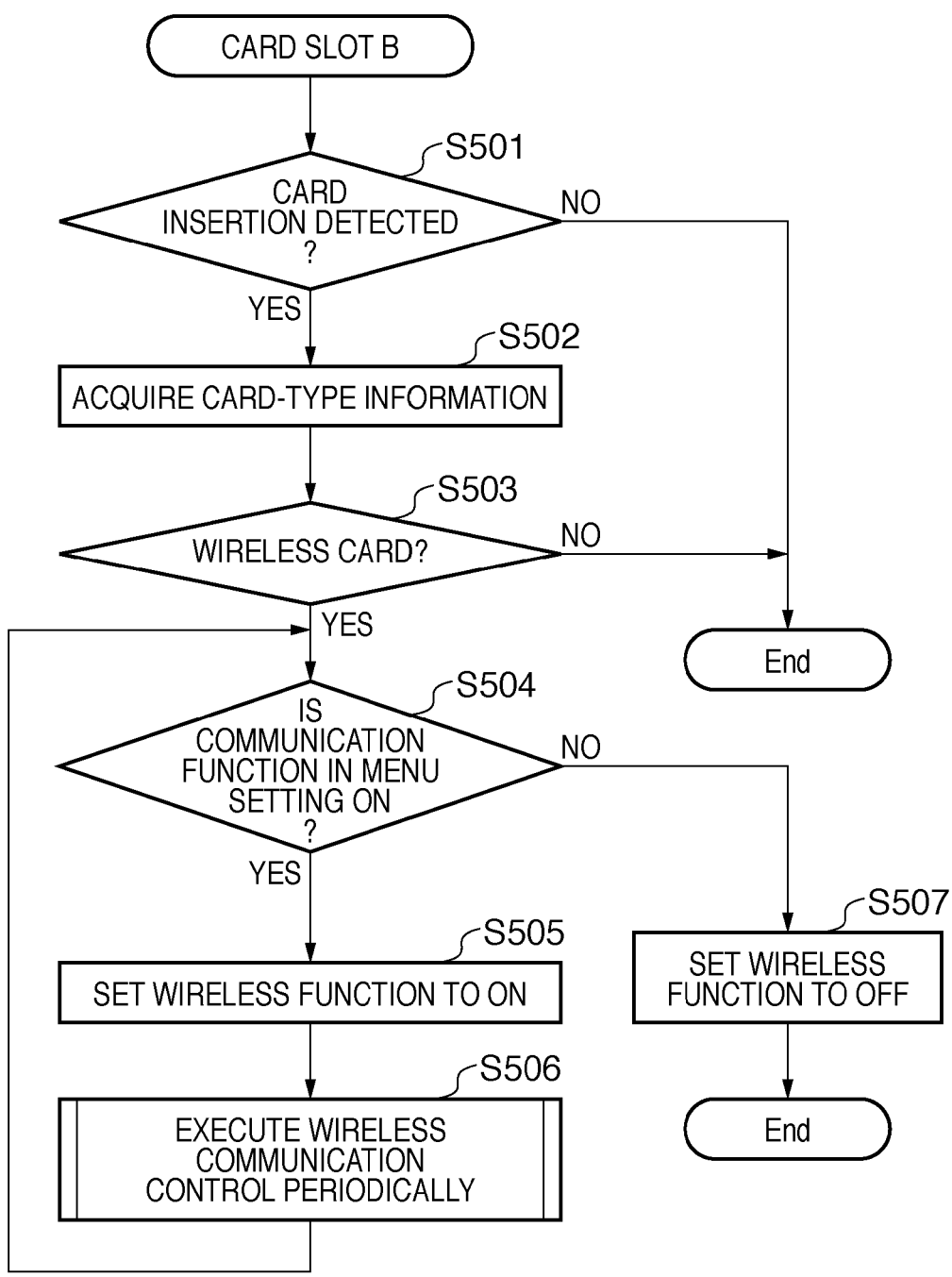

DATA PROCESSING APPARATUS AND METHOD OF CONTROLLING SAME

BACKGROUND OF THE INVENTION

1. Field of the Invention

The present invention relates to a data processing apparatus having a removable card possessing a wireless communication function, and to a method of controlling this apparatus.

2. Description of the Related Art

The specification of Japanese Patent Laid-Open No. 2005-100103 (Document 1) discloses a memory card having a wireless communication function (the card will be referred to as a "wireless card" below), the card having a shape the same as that of the usual memory card. The wireless card transfers a file, which has been recorded in a memory area of the card, to a previously set apparatus automatically through wireless communication. There is a possibility that a plurality of wireless cards will be inserted into an apparatus having multiple card slots. If a plurality of wireless cards that rely upon the same wireless communication scheme are inserted, radio interference occurs among the cards and communication efficiency undergoes a marked decline. In order to deal with this problem, U.S. Pat. No. 7,117,008 (Document 2) discloses a method of switching wireless communication means in accordance with priority in cases where a plurality of wireless communication functions are used simultaneously. Priority in this case is based upon communication overhead, amount of data and power consumption, etc.

In an apparatus previously equipped with a plurality of wireless communication functions, it is possible to set the priority of each wireless communication function beforehand, as described in Document 2. However, since a wireless card has communication means, the apparatus on the host side cannot use the wireless communication function of that card until the wireless card is inserted. This means that priority cannot be set in advance. In other words, it is necessary to set priorities or restrictions relating to wireless communication in accordance with the status of wireless card insertion.

SUMMARY OF THE INVENTION

The present invention has been devised in view of the foregoing circumstances and, in a preferred embodiment, provides a data processing apparatus capable of writing and reading data to and from wireless cards that have been inserted into multiple card slots, wherein radio-wave interference is prevented from occurring in a case where a plurality of wireless cards have been inserted, and provides also a method of controlling this apparatus.

According to one aspect of the present invention, there is provided a data processing apparatus having a plurality of card slots in which memory cards are removably inserted, the apparatus comprising: a determination unit configured to determine, with regard to each of the plurality of card slots, whether a memory card that has been inserted into the slot is a wireless card having a wireless communication function; and a control unit configured to permit, in a case where it is determined that a memory card that has been inserted into a first card slot among the plurality of card slots is the wireless card, enabling of the wireless communication function of the wireless card, and, in a case where it is determined that a memory card that has been inserted into a card slot other than the first card slot is the wireless card, to disable the wireless communication function of the wireless card.

Also, according to another aspect of the present invention, there is provided a method of controlling operation of a data processing apparatus having a plurality of card slots in which memory cards are removably inserted, the method comprising: a determination step of determining, with regard to each of the plurality of card slots, whether a memory card that has been inserted into the slot is a wireless card having a wireless communication function; and a control step of permitting, in a case where it is determined that a memory card that has been inserted into a first card slot among the plurality of card slots is the wireless card, enabling of the wireless communication function of the wireless card, and, in a case where it is determined that a memory card that has been inserted into a card slot other than the first card slot is the wireless card, disabling the wireless communication function of the wireless cards.

Further features of the present invention will become apparent from the following description of exemplary embodiments with reference to the attached drawings.

BRIEF DESCRIPTION OF THE DRAWINGS

FIG. 1 is a block diagram of a digital camera according to a preferred embodiment of the present invention;

FIGS. 2A to 2D are diagrams illustrating examples of displays for setting a wireless communication function;

FIG. 3 is a diagram useful in describing icons for displaying states of wireless cards;

FIG. 5 is a flowchart for describing processing according to the first embodiment.

DESCRIPTION OF THE EMBODIMENTS

First Embodiment

Figure 4A:
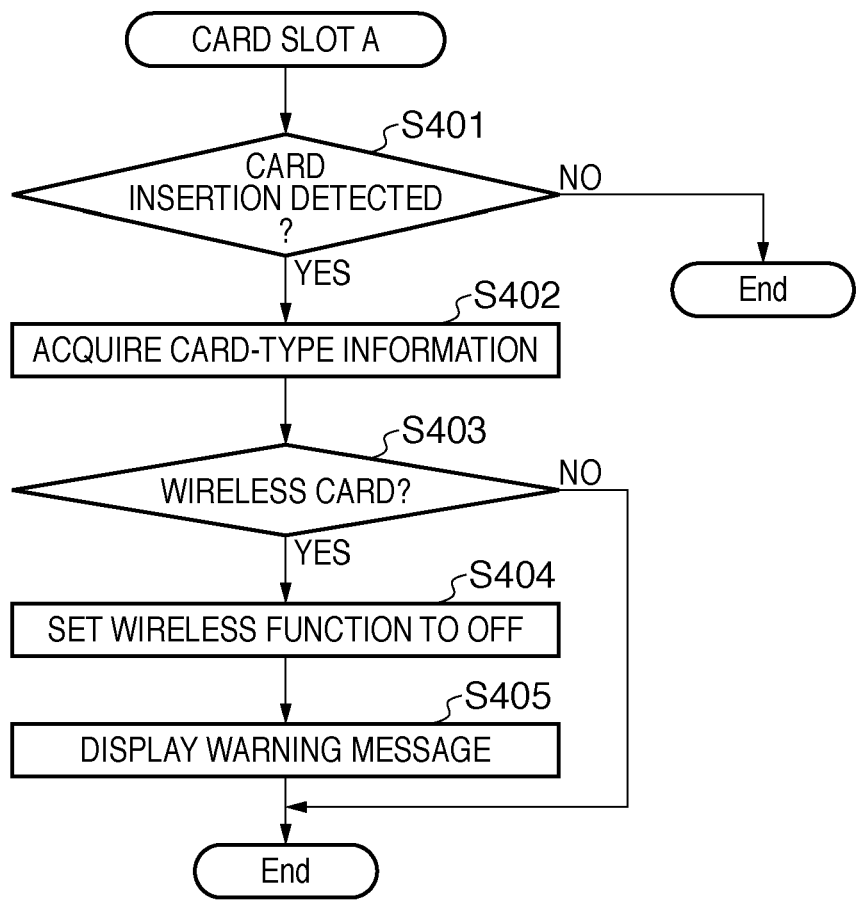
FIG. 4A is a processing flowchart according to a first embodiment of the present invention.

A preferred embodiment of the present invention will be described with reference to the accompanying drawings. In the description that follows, a digital camera will be described as an example of a data processing apparatus having multiple card slots in which memory cards can be removably inserted.

FIG. 1 is a block diagram illustrating a digital camera 100 as a data processing apparatus according to a first embodiment of the present invention. In FIG. 1, the digital camera 100 has card slots A and B as multiple card slots. A wireless card 200 and a wireless card 300 have been inserted into the card slots A and B, respectively. Although the wireless cards 200 and 300 have been inserted into the digital camera 100 in the illustration of FIG. 1, a general memory card not having a wireless communication function can also be inserted into the digital camera 100 using card slots A and B.

A system controller 130 is an MPU (Micro-Processing Unit) and includes a processor core and peripheral circuits such as a general-purpose IO port and an AD converter. Connected to the system controller 130 are a RAM (Random-Access Memory) 170, which is a temporary storage device, and a ROM (Read-Only Memory) 180, which is a secondary storage device, in which a program has been stored. The system controller 130 reads the program, which has been transferred and stored in the RAM 170 from the ROM 180, thereby controlling the components of the digital camera 100 and causing them to function as various means. Control of the digital camera 100 may be performed by a single item of hardware such as the system controller 130, or overall control of the apparatus may be performed by a plurality of items of hardware that share the processing load. An image that has been captured by an imaging unit 150 is converted to an image file by an image file generation unit 160. The system controller 130 writes an image file, which has been generated by the image file generation unit 160, to the wireless cards 200, 300 through card interfaces 142, 144, respectively. The card interface 142 is used for the memory card inserted into card slot A, and the card interface 144 is used for the memory card inserted into card slot B. The digital camera 100 is provided with a card detection switch 141 for detecting the card that has been inserted into card slot A, and with a card detection switch 143 for detecting the card that has been inserted into card slot B. The card interfaces 142, 144 and card detection switches 141, 143 are connected to the system controller 130 and are controllable by the system controller 130.

The card interfaces 142, 144 are capable of inputting and outputting signals to and from the wireless cards 200, 300, respectively, at a stipulated timing. They are also capable of exercising control to turn ON and OFF the supply of power to the wireless cards 200, 300. When the wireless cards 200, 300 are inserted into the card slots A, B, respectively, of the digital camera 100, the corresponding card detection switches 141, 143 are turned ON. As a result, the system controller 130 can detect that the cards have been inserted into the respective card slots A, B. The system controller 130 is capable of sending card controllers 210, 310 of the wireless cards commands for acquiring information concerning the wireless cards 200, 300. The system controller 130 can then detect the types of card based upon the information received from the card controllers 210, 310 of the wireless cards. A display unit 110 is used to display various information such as system information, images obtained by reproducing images that have been recorded, and a menu relating to the setting of a wireless communication function. By using an operation unit 120, the user performs various operations and sends instructions to the system controller 130.

It should be noted that the wireless cards 200, 300 are both memory cards (wireless cards) having the same wireless communication function. In the description that follows, therefore, the wireless card 200 that has been inserted into card slot A will be described with reference to the block diagram and the wireless card 300 that has been inserted into card slot B will not be described. Components denoted by reference numerals 210 to 280 are identical to those denoted by reference numerals 310 to 380.

In wireless card 200, card controller 210 is an MPU. A RAM 270, which is a temporary storage device, a ROM 280, which is a secondary storage device, a NAND-type flash memory element 220 and a wireless communication circuit 230 are connected to the card controller 210. As mentioned above, the RAM is a random-access memory and the ROM is a read-only memory.

Reading and writing of an image file, by the card controller 210, to the NAND-type flash memory element 220, which is a storage element, is performed in accordance with a command from the system controller 130 of digital camera 100, which is the host. Control relating to the wireless communication function and control for querying for information or the like is carried out by a special-purpose command from the system controller 130 of digital camera 100 to the card controller 210. Upon detecting that an image file has been written from the system controller 130, the card controller 210 transfers the image file to an external information storage device via wireless communication using the wireless communication circuit 230.

In the first embodiment, the system controller 130 turns off (disables) the wireless communication function so that radio waves will not be output in a case where the card that has been inserted into card slot A is the wireless card 200. Only in a case where the card that has been inserted into card slot B is the wireless card 300 does the system controller 130 permit the enabling of the wireless communication function of this wireless card, present a display relating to wireless communication and execute operations associated with user settings. It is assumed that although card slot A is adapted to turn off the wireless communication function of a wireless card, it is not adapted to utilize the wireless communication function of a wireless card. Further, it is assumed that card slot B is adapted to utilize the wireless communication function of a wireless card.

Figure 4B:
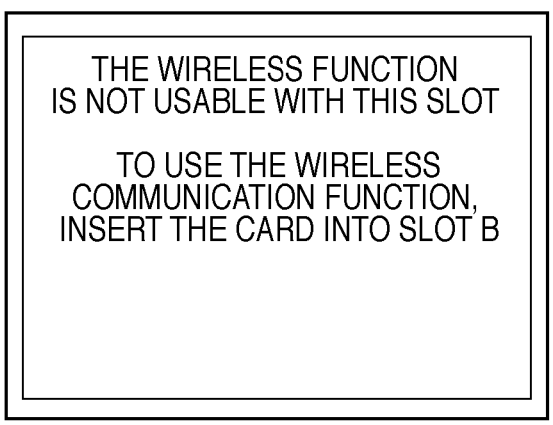
FIG. 4B is a diagram illustrating an example of display of a warning message.

FIG. 4A is a flowchart illustrating a control sequence of the system controller 130 when the wireless card 200 is inserted into card slot A. The system controller 130 detects insertion of the card based upon whether or not the card detection switch 141 of card slot A is being pressed (step S401). If card insertion is detected, the system controller 130 issues a command, which is for acquiring card identification information, to the card controller 210 of wireless card 200 that has been inserted into card slot A (step S402). From the information in the response received from the card controller 210 of wireless card 200 inserted into card slot A, the system controller 130 determines whether the card is a wireless card (step S403). If it is determined that the card is a wireless card, then the system controller 130 transmits a disable command, which is for turning off the wireless communication function, to the card controller 210 in order to turn off (disable) the wireless communication function (step S404). Further, in order to indicate that the wireless communication function of the wireless card 200 inserted into card slot A cannot be used, the system controller 130 causes the display unit 110 to display the warning message illustrated in FIG. 4B (step S405). The warning message shown in FIG. 4B contains information indicating the card slot that allows use of the wireless communication function. Thus the user is capable of obtaining information as to what should be done (insert the card in card slot B) in order to make use of the wireless communication function.

It should be noted that in a case where the file system of the wireless card 200 inserted into card slot A is initialized, the normal procedure is to execute card-unmount processing first and then perform a remounting operation after initialization is carried out. However, since the command turning off the wireless communication function has been transmitted to the wireless card, it is not necessary for the system controller 130 to re-transmit this turn-off command as long as the power supply has not been turned off. If the power supply has been turned off, however, it is required that the command for turning off the wireless communication function be transmitted again.

FIG. 5 is a flowchart illustrating a control sequence of the system controller 130 when the wireless card 300 is inserted into card slot B. The system controller 130 detects whether a memory card has been inserted based upon whether or not the card detection switch 143 of card slot B is being pressed (step S501). If insertion of a memory card is detected, the system controller 130 issues a command, which is for acquiring card identification information, to the card controller 310 of wireless card 300 that has been inserted into card slot B (step S502). From the information in the response received from the card controller 310 of wireless card 300 inserted into card slot B, the system controller 130 determines whether the memory card that has been inserted is a wireless card (step S503). If it is determined that the card is a wireless card, the system controller 130 transmits a command for setting the wireless communication function to the card controller 310 in accordance with the information of the menu setting. That is, in a case where the menu setting is such that the wireless communication function has been turned off, the system controller 130 sets the wireless communication function of this wireless card to OFF (steps S504, S507). On the other hand, in a case where the menu setting is such that the wireless communication function has been turned ON, the system controller 130 sets the wireless communication function of this wireless card to ON (step S504, S505) and executes processing relating to wireless communication control periodically (step S506).

Examples of displays of menus for setting the wireless communication function according to the first embodiment are shown in FIGS. 2A and 2B. By pressing a button 301 in FIG. 2A, a sub-menu shown in FIG. 2B appears and it becomes possible to select whether to enable or disable the wireless communication function. In this embodiment, the wireless communication function can be enabled only for card slot B. With this menu, therefore, only the setting of wireless card 300 inserted into card slot B is possible.

FIG. 3 is a diagram illustrating a display of icons that indicate states of the wireless card 300 inserted into card slot B. Icons indicated at id0 to id5 in FIG. 3 are displayed in accordance with the status of the card during the time that the wireless communication card is inserted into card slot B.

As mentioned above, this embodiment is such if a card that has been inserted into card slot A is a wireless card, the wireless communication function is turned off so as not to output radio waves, as mentioned above. A display relating to wireless communication is presented and an operation associated with user settings executed only in a case where a card that has been inserted into card slot B is a wireless communication card. Accordingly, an effect of the present invention is that even if wireless cards have been inserted into both card slots, the two wireless cards do not perform wireless communication simultaneously and, hence, communication interference can be prevented. Further, by limiting the slot that is capable of using the wireless communication function to card slot B, display areas for menu items and icons need not be prepared for card slot A. In addition, power consumption increases when performing wireless communication in comparison to that when the wireless communication function is not used and it is therefore necessary to strengthen the power supply and ground line and to deal with noise in terms of hardware. To alleviate this issue, this embodiment is such that support for the wireless communication function in the hardware on the side of card slot A can be eliminated, thereby making it possible to manufacture the product at low cost.

In the first embodiment, card slot A is fixed permanently as the card slot that does not possess the wireless communication function. However, this does not impose a limitation upon the present invention. That is, it may be arranged so that the card slots A and B are made card slots that are switchable between enabling and disabling of the wireless communication function of the wireless cards, and so that the user is allowed to select the card slot that will be caused to function as the card slot capable of utilizing the wireless communication function. Further, in a case where card slot A has been selected as the card slot capable of utilizing the wireless communication function, the system controller 130 may set card slot B automatically as the card slot that is incapable of utilizing the wireless communication function. Further, in a case where card slot B has been selected as the card slot capable of utilizing the wireless communication function, the system controller 130 may set card slot A automatically as the card slot that is incapable of utilizing the wireless communication function. In such case, it will suffice to arrange it so that the system controller 130 executes the following processing for each card slot:

determine whether the slot has been selected as the card slot capable of utilizing the wireless communication function;

execute the flowchart shown in FIG. 4A if the slot has not been selected as the card slot capable of utilizing the wireless communication function; and execute the flowchart shown in FIG. 5 if the slot has been selected as the card slot capable of utilizing the wireless communication function.

Second Embodiment

In the first embodiment, the wireless communication function of the card that has been inserted into a specific card slot is turned off. In a second embodiment, the wireless communication function of the card inserted last is enabled. Accordingly, in a case where a card slot in which a wireless card has already been inserted exists, control is exercised in such a manner that when there is no longer any card content to be communicated by the wireless communication function of this wireless card (when all images have been transmitted, for example), the wireless communication function of the wireless card inserted next is enabled. It should be noted that the block diagrams of the recording apparatus (digital camera) and wireless card in the second embodiment are the same as those of the first embodiment and need not be described again.

Figure 6:
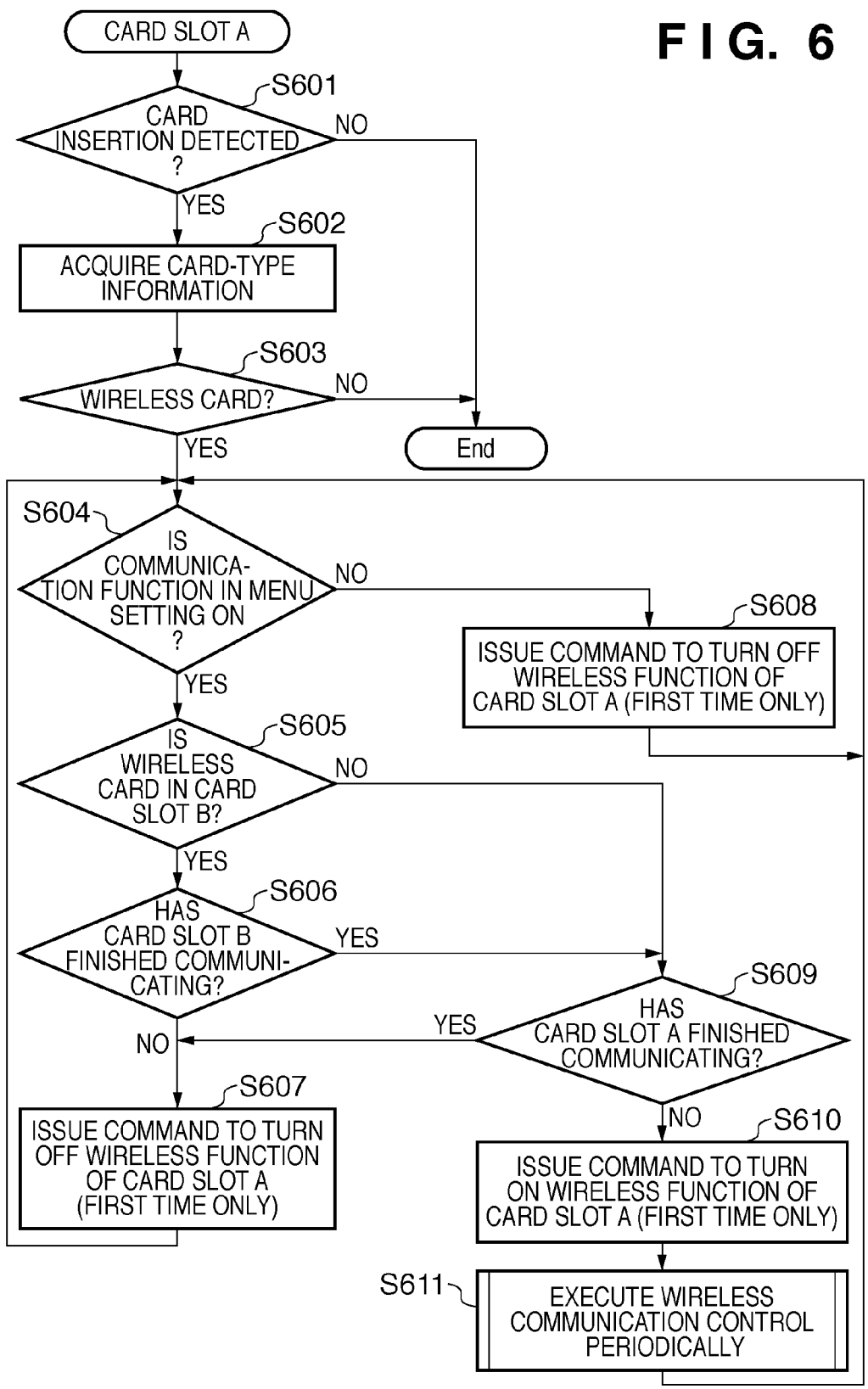
FIG. 6 is a flowchart for describing processing according to a second embodiment of the present invention.

FIG. 6 is a flowchart illustrating a control sequence of the system controller 130 when a memory card is inserted into card slot A. The processing of steps S601 to S603 to similar to the processing of step S401 to S403 of FIG. 4A. From the information in the response received from the card controller 210 of the memory card inserted into card slot A, the system controller 130 determines whether the card is a wireless card (step S603). If it is determined that the card is a wireless card, the system controller 130 checks the status of the menu setting regarding the wireless communication function (step S604). If the menu setting of the wireless communication function has been set to OFF, the system controller 130 transmits a disable command, which is for turning off the wireless communication function, to the card controller 210 (step S608). It should be noted that the processing of step S608 is executed only the first time it is branched to from step S604.

On the other hand, if the menu setting of the wireless communication function has been set to ON, then the system controller 130 checks to determine whether a wireless card has already been inserted into card slot B (step S605). It should be noted that if a wireless card is inserted into card slot B after a wireless card has been inserted into card slot A, a "NO" decision is rendered at step S605 because the card will not have "already" been inserted into card slot B. If a wireless card has already been inserted into card slot B, then the system controller 130 checks to determine whether communication by the wireless card of card slot B has ended (step S606). It should be noted that a state in which communication has not ended in this embodiment means a state in which communication of data by the wireless card is still in progress. If it is determined that communication has not ended, the system controller 130 transmits a disable command, which is for turning off the wireless communication function, to the card controller 210 of wireless card 200 that has been inserted into card slot A (step S607). The system controller 130 then waits for the end of communication by wireless card 300 that has been inserted into card slot B. As a result, if, when assignment of the wireless communication function is switched over between the card slots, wireless data communication is being performed in the card slot whose wireless communication function is ON at this time, the switch is executed upon waiting for the end of this data communication. It should be noted that the processing of step S607 is executed only the first time it is branched to from step S606.

If it is determined that a wireless card has not been inserted into card slot B (step S605), or if it is determined that communication by the wireless card 300 that has been inserted into card slot B has ended (step S606), the processing proceeds to step S609. At step S609, the system controller 130 checks to determine whether communication by the wireless card 200 that has been inserted into card slot A has ended. If communication by the wireless card 200 that has been inserted into card slot A has ended, the system controller 130 turns off the wireless communication function of the wireless card 200 that has been inserted into card slot A. That is, the system controller 130 transmits a disable command, which is for turning off the wireless communication function, to the card controller 210 of wireless card 200 (step S607). On the other hand, if communication by the wireless card 200 that has been inserted into card slot A has not ended, the system controller 130 enables the wireless communication function of wireless card 200 inserted into card slot A. That is, the system controller 130 transmits an enable command, which is for turning on the wireless communication function, to the card controller 210 (step S610) and then executes periodically processing relating to wireless communication control (step S611).

It should be noted that although FIG. 6 illustrates a flowchart of processing relating to card slot A, similar processing is executed with respect to card slot B as well. Accordingly, by replacing card slot A in FIG. 6 with card slot B and replacing card slot B with card slot A, the flowchart can be made one showing the processing relating to card slot B. Further, it will suffice if the system controller 130 transmits the command for setting the wireless communication function to the card controller 210 only when the wireless communication function changes from ON to OFF and from OFF to ON at steps S607, S608 and S610 described above. Furthermore, the determination as to whether communication at each slot has ended is rendered by causing the system controller 130 to query the card controller 210 as to whether communication has ended.

As described above, the second embodiment is characterized by the fact that use is made of the wireless communication function of the card inserted first. This means that the user can use the card slots without distinguishing between card slot A and card slot B. Further, with regard to a wireless card that has been inserted after, the wireless communication function of this card is switched ON at the stage where communication by the wireless card inserted first ends. This makes it possible to perform wireless communication successively.

Third Embodiment

In a third embodiment, a method of using a menu to select a card slot whose wireless communication function is to be enabled will be described.

FIGS. 2C and 2D are examples of displays for setting a wireless communication function according to the third embodiment. By pressing a button 311 in FIG. 2C, a sub-menu shown in FIG. 2D appears and it becomes possible to select whether to enable or disable the wireless communication function. The setting items in FIG. 2D make it possible to select only the card slot into which a wireless card has been inserted. The selection item pertaining to the card slot into which a wireless card has not been inserted is grayed out (dimmed) and thus is made unselectable. When the system controller 130 detects that a wireless card has been inserted anew, the changeover menu shown in FIG. 2D is displayed in a state 312, in which the card slot into which the wireless card has been inserted anew has been selected. Adopting this arrangement makes it possible to promptly select the wireless card of the card slot into which the card has been newly inserted.

Although the present invention has been described in detail based upon preferred embodiments thereof, the present invention is not limited to these specific embodiments and various forms of the invention within a scope that does not depart from the gist of the invention also fall within the present invention. That is, the foregoing embodiments merely illustrate one form of the present invention and portions of the foregoing embodiments may be suitably combined, by way of example.

Further, in the foregoing embodiments, a data processing apparatus having two card slots as multiple card slots is described. However, it is obvious that the present invention is applicable also to a data processing apparatus having three or more card slots. For example, in the first embodiment, it will suffice if one of three or more card slots is made a first card slot having the function of card slot B and card slots other than the first card slot are made card slots having the function of card slot A. Further, in an arrangement in which a first card slot having the function of card slot B is selected from among multiple card slots, it will suffice to arrange it so that the user can select only one of the multiple card slots as the first card slot. Further, in the second embodiment, each of multiple card slots may be made card slots for which the processing shown in FIG. 6 is executed, card slot B in the flowchart is replaced by another card slot and card slot A is replaced by this card slot. Further, in the third embodiment, menu items the number of which is equivalent to the number of card slots need only be prepared.

In accordance with the present invention, it is possible to prevent interference of radio waves in a case where multiple cards each having a wireless communication function have been inserted into a data processing apparatus.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-286967, filed Dec. 17, 2009, which is hereby incorporated by reference herein in its entirety.

What is claimed is:

1. A data processing apparatus having a plurality of card slots in which memory cards are removably inserted, said apparatus comprising:
   a determination unit configured to determine, with regard to each of the plurality of card slots, whether a memory card that has been inserted into the slot is a wireless card having a wireless communication function; and
   a control unit configured to permit, in a case where it is determined that a memory card that has been inserted into a first card slot among the plurality of card slots is the wireless card, enabling of the wireless communication function of the wireless card, and, in a case where it is determined that a memory card that has been inserted into a card slot other than the first card slot is the wireless card, to disable the wireless communication function of the wireless card.

2. The apparatus according to claim 1, wherein the first card slot is fixed as a specific card slot among the plurality of card slots.

3. The apparatus according to claim 1, wherein each of the plurality of card slots is switchable to a state in which the wireless communication function of the wireless card is enabled or disabled, and said apparatus further comprises a selection unit configured to allow the user to select, from among the plurality of card slots, a card slot made to function as the first card slot.

4. The apparatus according to claim 1, further comprising a display unit configured to display a warning, which indicates that the wireless communication function is not usable, in a case where the wireless card has been inserted into a card slot other than the first card slot among the plurality of card slots.

5. The apparatus according to claim 4, wherein a display presented by said display unit includes information indicating the card slot that is functioning as the first card slot among the plurality of card slots.

6. The apparatus according to claim 1, wherein each of the plurality of card slots is switchable to a state in which the wireless communication function of the wireless card is enabled or disabled; and
   said control unit switches assignment of the function with respect to the plurality of card slots in such a manner that a card slot into which a wireless card has been inserted last will function as the first card slot among the plurality of card slots.

7. The apparatus according to claim 6, wherein in a case where wireless data communication is being executed in a card slot that is functioning as the first card slot at the moment the function is switched, said control unit executes the switch upon waiting for end of this data communication.

8. A method of controlling operation of a data processing apparatus having a plurality of card slots in which memory cards are removably inserted, said method comprising:
   a determination step of determining, with regard to each of the plurality of card slots, whether a memory card that has been inserted into the slot is a wireless card having a wireless communication function; and
   a control step of permitting, in a case where it is determined that a memory card that has been inserted into a first card slot among the plurality of card slots is the wireless card, enabling of the wireless communication function of the wireless card, and, in a case where it is determined that a memory card that has been inserted into a card slot other than the first card slot is the wireless card, disabling the wireless communication function of the wireless card.

* * * * *